(12) United States Patent
Koshimizu

(10) Patent No.: US 12,176,187 B2
(45) Date of Patent: *Dec. 24, 2024

(54) CLEANING METHOD AND PLASMA PROCESSING APPARATUS

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/238,522

(22) Filed: Aug. 28, 2023

(65) Prior Publication Data

US 2023/0402269 A1 Dec. 14, 2023

Related U.S. Application Data

(63) Continuation of application No. 17/178,833, filed on Feb. 18, 2021, now Pat. No. 11,804,368.

(30) Foreign Application Priority Data

Mar. 2, 2020 (JP) .................................. 2020-034907
Nov. 30, 2020 (JP) .................................. 2020-197852

(51) Int. Cl.
*H01J 37/32* (2006.01)

(52) U.S. Cl.
CPC .... *H01J 37/32862* (2013.01); *H01J 37/3244* (2013.01); *H01J 37/32568* (2013.01);
(Continued)

(58) Field of Classification Search
CPC ............ C23C 16/4405; H01J 37/32091; H01J 37/3244; H01J 37/32568; H01J 37/32642;
(Continued)

(56) References Cited

U.S. PATENT DOCUMENTS 6,367,413 B1* 4/2002 Sill ....................... H01J 37/321
118/728
6,709,547 B1 3/2004 Ni et al.
(Continued)

FOREIGN PATENT DOCUMENTS

JP 2012-146742 A 8/2012
JP 2018-010992 A 1/2018

*Primary Examiner* — Benjamin Kendall
(74) *Attorney, Agent, or Firm* — XSENSUS LLP

(57) ABSTRACT

A plasma processing apparatus includes: a plasma processing chamber; a substrate support disposed in the plasma processing chamber; an edge ring disposed on the substrate support to surround a substrate on the substrate support; an actuator configured to vertically move the edge ring; a gas supply configured to supply a cleaning gas into the plasma processing chamber; a power source configured to supply a power to the substrate support; and a controller configured to: (a) maintain the edge ring at a first position spaced apart from the substrate support; and (b) supply a power to the substrate support while supplying the cleaning gas into the plasma processing chamber to generate a local plasma in a gap between the edge ring maintained at the first position and the substrate support, thereby cleaning the edge ring and the substrate support.

18 Claims, 9 Drawing Sheets

(52) U.S. Cl.
CPC .. *H01J 37/32642* (2013.01); *H01J 37/32715* (2013.01); *H01J 2237/1502* (2013.01); *H01J 2237/334* (2013.01)

(58) Field of Classification Search
CPC ........... H01J 37/32715; H01J 37/32862; H01J 2237/1502; H01J 2237/334
See application file for complete search history.

(56) References Cited

U.S. PATENT DOCUMENTS

| | | |
|---|---|---|
| 9,011,637 B2 | 4/2015 | Yamamoto |
| 2003/0201069 A1 | 10/2003 | Johnson |
| 2011/0031111 A1 | 2/2011 | Kobayashi |
| 2011/0031217 A1* | 2/2011 | Himori ............. H01J 37/32091 |
| | | 156/345.48 |
| 2012/0175063 A1* | 7/2012 | Yamawaku ....... H01L 21/67069 |
| | | 156/345.46 |
| 2013/0186858 A1* | 7/2013 | Suzuki .............. H01L 21/68757 |
| | | 156/345.34 |
| 2016/0189994 A1* | 6/2016 | Sasaki ............... H01L 21/67109 |
| | | 361/234 |
| 2017/0213758 A1 | 7/2017 | Rice et al. |
| 2018/0151334 A1 | 5/2018 | Lin et al. |
| 2020/0266088 A1* | 8/2020 | Kosakai ........... H01L 21/76826 |
| 2020/0373193 A1 | 11/2020 | Kamp et al. |

* cited by examiner

CLEANING METHOD AND PLASMA PROCESSING APPARATUS

CROSS-REFERENCE TO RELATED APPLICATIONS

This application is a continuation application of U.S. patent application Ser. No. 17/178,833, filed on Feb. 18, 2021, which claims priorities from Japanese Patent Application Nos. 2020-034907 and 2020-197852, filed on Mar. 2, 2020 and Nov. 30, 2020, respectively, with the Japan Patent Office, all of which are incorporated herein in their entireties by reference.

TECHNICAL FIELD

The present disclosure relates to a cleaning method and a plasma processing apparatus.

BACKGROUND

In a plasma processing apparatus, a consumable component called a focus ring (hereinafter, also referred to as an edge ring) is used. The focus ring is configured by, for example, a two-split focus ring that includes an inner focus ring and an outer focus ring. Since deposits adhere between the inner focus ring and the outer focus ring due to a processing of a substrate, a technique of removing the deposits has been proposed (Japanese Patent Laid-Open Publication No. 2012-146742).

Further, a method of replacing the focus ring using a transfer device without opening a processing chamber to the atmosphere has been proposed (Japanese Patent Laid-Open Publication No. 2018-010992). According to the method, in order to suppress the deposits in the processing chamber from swirling up when the focus ring is transferred from the chamber, a cleaning is performed to remove the deposits by, for example, plasma of a processing gas. Further, it has been proposed to clean the surface on which the focus ring has been disposed, after the focus ring is transferred from the chamber.

SUMMARY

According to an aspect of the present disclosure, a plasma processing apparatus includes: a plasma processing chamber; a substrate support disposed in the plasma processing chamber; an edge ring disposed on the substrate support to surround a substrate on the substrate support; an actuator configured to vertically move the edge ring; a gas supply configured to supply a cleaning gas into the plasma processing chamber; a power source configured to supply a power to the substrate support; and a controller configured to: (a) maintain the edge ring at a first position spaced apart from the substrate support; and (b) supply a power to the substrate support while supplying the cleaning gas into the plasma processing chamber to generate a local plasma in a gap between the edge ring maintained at the first position and the substrate support, thereby cleaning the edge ring and the substrate support.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
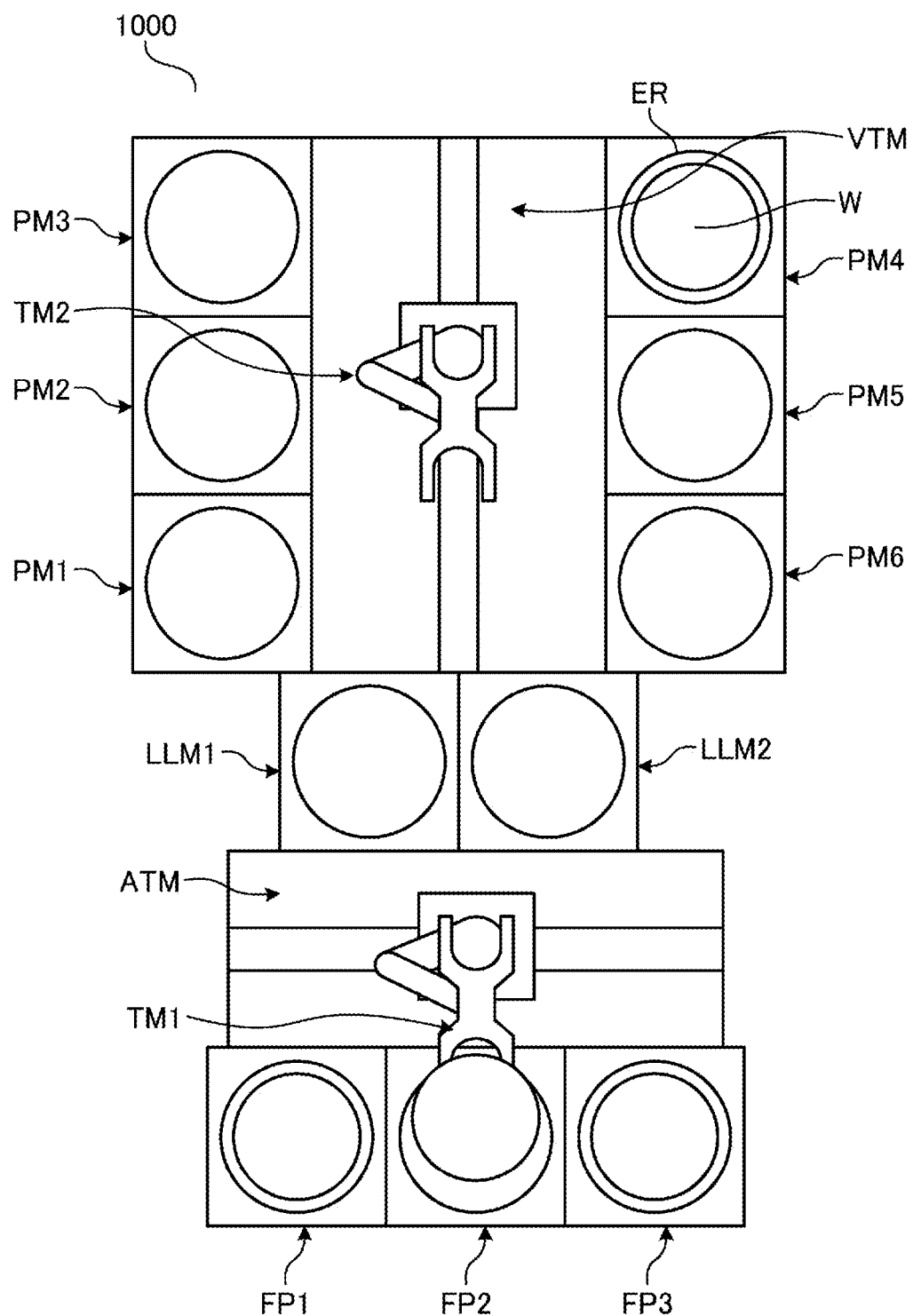
FIG. 1 is a view illustrating an example of a transfer system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments of the present disclosure will be described in detail based on the accompanying drawings. The present disclosure is not limited to the embodiments. The embodiments may be appropriately combined with each other within the scope that does not cause any inconsistency in process contents. In the respective drawings, similar or corresponding components will be denoted by the same reference numerals.

As described above, the technique has been known which removes deposits deposited in a plasma processing apparatus through a cleaning using plasma. However, deposits adhere to even a tiny gap between components disposed in a chamber, according to conditions of a plasma processing. For example, deposits may adhere to, for example, a gap between an edge ring and a stage or a recess formed in the stage. The cleaning for removing the deposits that adhere to the tiny gap requires a relatively long time. For example, the time for performing the cleaning after an etching for forming a deep micro hole may be as long as being equal to the time for performing the etching, or may be at least ⅓ of the time for performing the etching. Thus, the throughput of the plasma processing decreases due to the cleaning.

Further, when the cleaning is performed in a state where the surface of the stage is exposed to the plasma space, the surface of the stage is damaged. Thus, for example, Japanese Patent Laid-Open Publication No. 2018-010992 proposes performing the cleaning in a state where a dummy wafer is placed on an electrostatic chuck. However, since it takes time for a worker to carry the dummy wafer in/out, the throughput decreases in this case as well.

Thus, a method capable of efficiently cleaning the plasma processing apparatus is required.

Embodiment

FIG. 1 is a view illustrating an example of a configuration of a transfer system 1000 according to an embodiment. FIG. 1 is a top view of the transfer system 1000. The transfer system 1000 includes accommodation containers FP, an atmospheric transfer chamber ATM, load lock modules LLM, a vacuum transfer chamber VTM, and processing apparatuses PM. A first transfer device TM1 is disposed in the atmosphere transfer chamber ATM. A second transfer device TM2 is disposed in the vacuum transfer chamber VTM. FIG. 1 illustrates three accommodation containers FP1 to FP3, six processing apparatuses PM1 to PM6, and two load lock modules LLM1 and LLM2. The number of the components is not limited to the number illustrated in FIG. 1, and may be smaller or more than the number illustrated in FIG. 1. When the components do not need to be distinguished from each other, the accommodation containers, the processing apparatuses, and the load lock modules will be collectively referred to as FP, PM, and LLM, respectively.

The first transfer device TM1 transfers a substrate W or an edge ring ER accommodated in the accommodation container FP from the accommodation container FP, and transfers the substrate W or the edge ring ER into the load lock module LLM. The second transfer device TM2 transfers the substrate W or the edge ring ER from the load lock module LLM, and transfers the substrate W or the edge ring ER into the processing apparatus PM in which a plasma processing is to be performed. After the plasma processing is completed, the second transfer device TM2 transfers the substrate W or the edge ring ER out from the processing apparatus PM, and transfers the substrate W or the edge ring ER to the processing apparatus PM in which a subsequent processing is to be performed, or the load lock module LLM. The substrate W or the edge ring ER transferred from the vacuum transfer chamber VTM into the load lock module LLM is transferred from the load lock module LLM into the atmosphere transfer chamber ATM and returned to the accommodation container FP, by the first transfer device TM1. Although not illustrated in FIG. 1, the accommodation container FP that accommodates the edge ring ER may be connected directly to the vacuum transfer chamber VTM. In this case, when it becomes time to replace the edge ring ER, the second transfer device TM2 transfers the consumed edge ring ER that will be replaced, out from the processing apparatus PM, and accommodates the edge ring ER in the accommodation container FP. Further, the second transfer device TM2 takes an unused edge ring ER out from the accommodation container FP, and transfers the edge ring ER to the processing apparatus PM.

The atmospheric transfer chamber ATM is kept in the atmospheric environment. The load lock module LLM includes an exhaust device, a plurality of openings connected to the atmospheric transfer chamber ATM and the vacuum transfer chamber VTM, respectively, and a gate valve that covers each of the openings in an openable/closable manner. The load lock module LLM is decompressed to a decompressed atmosphere by the exhaust device before the load lock module LLM communicates with the vacuum transfer chamber VTM. Each of the vacuum transfer chamber VTM and the processing apparatus PM also includes an exhaust device. An opening and a gate valve that covers the opening in an openable/closable manner are provided between the vacuum transfer chamber VTM and each processing apparatus PM.

With this configuration, the transfer system 1000 is able to transfer the substrate W and the edge ring ER between the processing apparatus PM in which a plasma processing is to be performed and the accommodation container FP, without requiring the manpower. The details of the configuration of the transfer system 1000 are not particularly limited, and, for example, the configuration described in Japanese Patent Laid-Open Publication No. 2018-010992 may be adopted.

Embodiment

Figure 2:
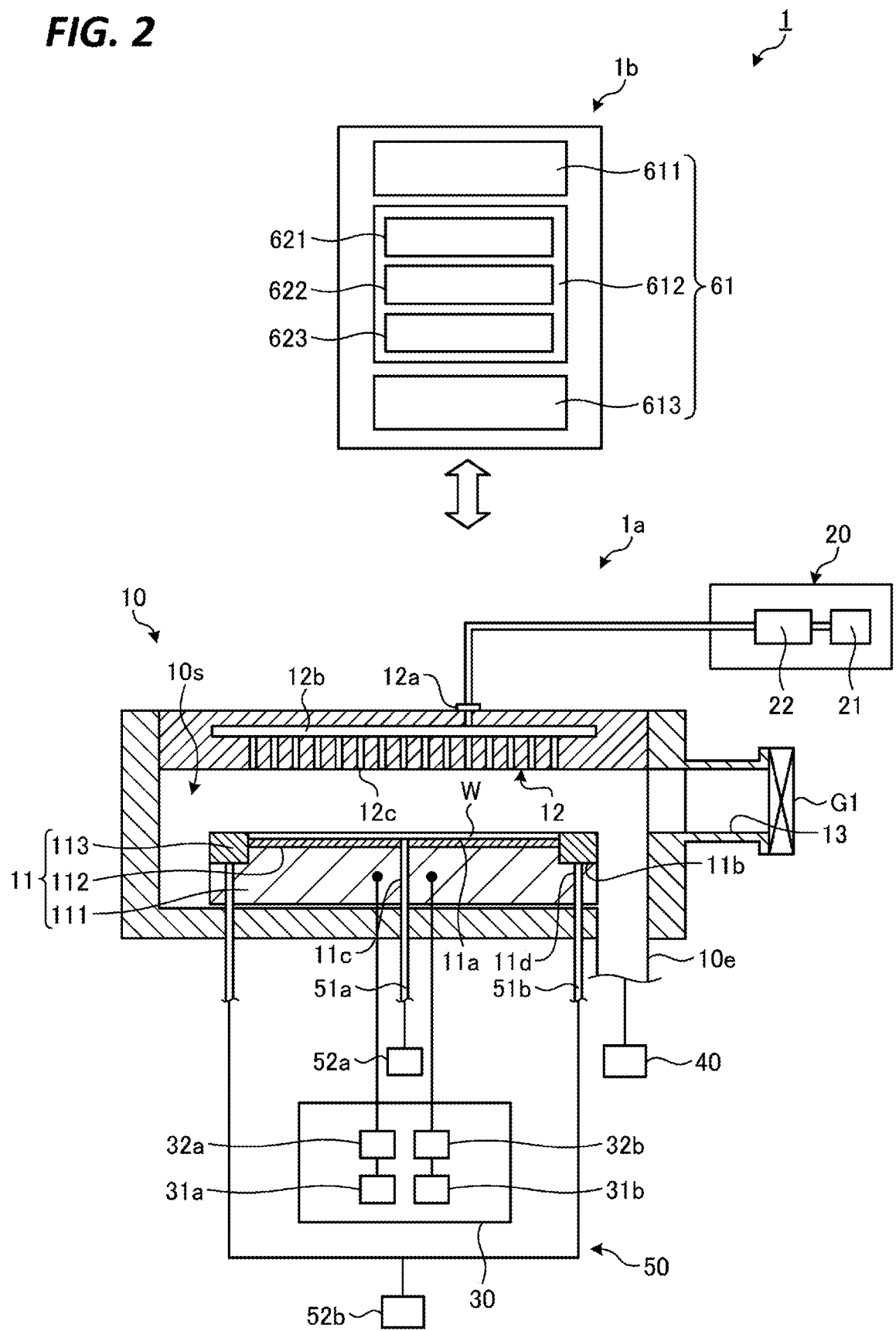
FIG. 2 is a view illustrating an example of a plasma processing system according to an embodiment.

FIG. 2 is a view illustrating an example of a configuration of a plasma processing system 1 according to an embodiment. In an embodiment, the plasma processing system 1 includes a plasma processing apparatus 1a and a controller 1b. The plasma processing apparatus 1a corresponds to the processing apparatus PM illustrated in FIG. 1. All of the processing apparatuses PM1 to PM6 illustrated in FIG. 1 may have the same configuration as that of the plasma processing apparatus 1a of FIG. 2, or some of the processing apparatuses PM1 to PM6 may have the same configuration as that of the plasma processing apparatus 1a of FIG. 2. Further, one controller 1b may be provided for one processing apparatus PM. In another example, a common controller may be provided for all of the six processing apparatuses PM, to collectively control the plurality of processing apparatuses PM. Further, a higher-level controller may be provided to collectively control the plurality of controllers 1b provided for the processing apparatuses PM, respectively.

The plasma processing apparatus 1a includes a chamber 10, a gas supply 20, a radio-frequency (RF) power supply (RF power supply) 30, an exhaust system 40, and a lifting device 50. Further, the plasma processing apparatus 1a includes a substrate support (stage) 11 and an upper-electrode shower head 12. The substrate support 11 is disposed at a lower area of the plasma processing space 10s inside the chamber 10. The upper-electrode shower head 12 is disposed above the substrate support 11, and may function as a portion of the ceiling of the chamber 10.

The substrate support 11 is configured to support the substrate W in the plasma processing space 10s. The substrate support 11 includes a first placement portion and a second placement portion. In an embodiment, the substrate support 11 includes a lower electrode 111, an electrostatic chuck 112, and an edge ring 113 (corresponding to the edge ring ER in FIG. 1). The electrostatic chuck 112 is disposed on the lower electrode 111, and configured to support the substrate W on the upper surface thereof. An electrode 112a (a first electrode; see, e.g., FIG. 4) is disposed in the electrostatic chuck 112. The edge ring 113 is disposed to surround the substrate W on the upper surface of the peripheral edge of the lower electrode 111. Although not illustrated, in an embodiment, the substrate support 11 may include a temperature control module configured to adjust at least one of the electrostatic chuck 112 and the substrate W to a target temperature. The temperature control module may include a heater, a flow path, or a combination thereof. A temperature control fluid such as a refrigerant or a heat transfer gas flows in the flow path.

The upper surface of the substrate support 11 is divided into a first placement surface 11a on which the substrate W is to be placed, and a second placement surface 11b on which the edge ring 113 is disposed. The first placement surface 11a is configured as a circular surface disposed at the center of the substrate support 11 and having a diameter slightly smaller than that of the substrate W. The second placement surface 11b surrounds the outer periphery of the first placement surface 11a, and is disposed below the first placement surface 11a, that is, relatively close to the bottom surface of the chamber 10. For example, the upper surface of the first placement portion corresponds to the first placement surface 11a, and the upper surface of the second placement portion corresponds to the second placement surface 11b. That is, the first placement portion places the substrate W thereon, and the second placement portion places the edge ring 113 thereon.

The upper-electrode shower head 12 is configured to supply one or more processing gases from the gas supply 20 into the plasma processing space 10s. In an embodiment, the upper-electrode shower head 12 includes a gas inlet 12a, a gas diffusion chamber 12b, and a plurality of gas outlets 12c. The gas inlet 12a is provide in fluid communication with the gas supply 20 and the gas diffusion chamber 12b. The plurality of gas outlets 12c are provided in fluid communication with the gas diffusion chamber 12b and the plasma processing space 10s. In an embodiment, the upper-electrode shower head 12 is configured to supply one or more processing gases from the gas inlet 12a into the plasma processing space 10s through the gas diffusion chamber 12b and the plurality of gas outlets 12c.

The gas supply 20 may include one or more gas sources 21 and one or more flow rate controllers 22. In an embodiment, the gas supply 20 is configured to supply one or more processing gases from their corresponding gas sources 21 to the gas inlet 12a through their corresponding flow rate controllers 22. Each flow rate controller 22 may include, for example, a mass flow controller or a pressure-controlled flow rate controller. The gas supply 20 may include one or more flow rate modulating devices that modulate or pulse the flow rates of one or more processing gases.

The RF power supply 30 is configured to supply an RF power, for example, one or more RF signals to one or more electrodes such as the lower electrode 111, the upper-electrode shower head 12, or both the lower electrode 111 and the upper-electrode shower head 12. FIG. 2 illustrates an example where the RF power supply 30 supplies RF signals to the lower electrode 111. As a result, plasma is generated from one or more processing gases supplied into the plasma processing space 10s. In an embodiment, the RF power supply 30 includes two RF generators 31a and 31b and two matching circuits 32a and 32b. Filters may be provided, in addition to the matching circuits 32a and 32b.

In an embodiment, the RF power supply 30 is configured to supply a first RF signal from the RF generator 31a to the lower electrode 111 via the matching circuit 32a. For example, the first RF signal may have a frequency in the range of 27 MHz to 100 MHz.

In an embodiment, the RF power supply 30 is configured to supply a second RF signal from the RF generator 31b to the lower electrode 111 via the matching circuit 32b. For example, the second RF signal may have a frequency in the range of 200 kHz to 13.56 MHz.

During the plasma processing of the substrate W, for example, the RF generator 31a may apply a radio-frequency power of a relatively high frequency, for example, 60 MHz, for generating plasma to the lower electrode 111. Meanwhile, the RF generator 31b may apply a radio-frequency power of a relatively low frequency, for example, 2 MHz, for attracting ions to the lower electrode 111.

Instead of the RF generator 31a, a direct current (DC) pulse generator may be used. While the example of FIG. 2 represents the configuration where the RF signals (or DC pulses) are supplied to the lower electrode 111, the RF signals (or DC pulse) may be supplied to the electrode disposed in the electrostatic chuck 112 (hereinafter, referred to as the first electrode), instead of the lower electrode 111. This configuration will be described as a modification later. The DC voltage may be applied to the upper-electrode shower head 12.

The exhaust system 40 may be connected to an exhaust port 10e provided, for example, at the bottom of the chamber 10. The exhaust system 40 may include a pressure valve and a vacuum pump. The vacuum pump may include a turbo molecular pump, a roughing pump, or a combination thereof.

An opening 13 is formed in the side wall of the chamber 10, and provided with an openable/closable gate valve G1. The opening 13 communicates with, for example, the vacuum transfer chamber VTM illustrated in FIG. 1. The space inside the vacuum transfer chamber VTM and the plasma processing space 10s inside the chamber 10 are blocked by the gate valve G1. The substrate W and the edge ring 113 are transferred between the vacuum transfer chamber VTM and the chamber 10 through the opening 13 by the second transfer device TM2 provided in the transfer system 1000 described above.

The lifting device 50 includes a first lifter pin 51a, a first actuator 52a, a second lifter pin 51b, and a second actuator 52b. The first lifter pin 51a is disposed inside a first through hole 11c. The first through hole 11c extends vertically inside the substrate support 11, and is opened at the first placement surface 11a. The first lifter pin 51a moves up and down by the first actuator 52a. The substrate W placed on the first placement surface 11a is lifted from the first placement surface 11a along with the upward-movement of the first lifter pin 51a. A gripping member such as an arm provided in the second transfer device TM2 enters the chamber 10 through the gate valve G1, receives the substrate W lifted by the first lifter pin 51a, and transfers the substrate W from the chamber 10. When the substrate W is transferred into the chamber 10, the respective components operate in the reverse order to that when the substrate W is transferred. While FIG. 2 illustrates one first lifter pin 51a and one first through hole 11c, the number of the first lifter pins 51a and the number of the first through holes 11c are not particularly limited. The first lifter pin 51a and the first through hole 11c may be provided as many as the number that makes the substrate W stable when the substrate W is lifted.

The second lifter pin 51b is disposed inside a second through hole 11d. In an embodiment, the second through hole 11d extends vertically inside the substrate support 11, and is opened at the second placement surface 11b. The second lifter pin 51b moves up and down by the second actuator 52b. The second lifter pin 51b may have a function to move on the horizontal plane by several millimeters. When the deposition amount in the gap between the edge ring and the substrate support is not uniform, the edge ring may be made biased to the substrate support 11 so as to generate plasma preferentially at a portion where the deposition amount is relatively large. The edge ring 113 disposed on the second placement surface 11b is lifted from the second placement surface 11b along with the upward-movement of the second lifter pin 51b. Similar to the substrate W, the edge ring 113 may be transferred from and into the chamber 10 by the second transfer device TM2. The number of second lifter pins 51b and the number of second through holes 11d are also not particularly limited, and may be provided as many as the number that makes the edge ring 113 stable when the edge ring 113 is lifted.

In the example of FIG. 2, the first and second lifter pins 51a and 51b move up and down by the first and second actuators 52a and 52b. However, the mechanism that moves the first and second lifter pins 51a and 51b up and down is not particularly limited. One common lifting mechanism may be provided for the plurality of first lifter pins 51a, and similarly, one common lifting mechanism may be provided for the plurality of second lifter pins 51b. Further, a lifting mechanism may be provided for each lifter pin.

In an embodiment, the controller 1b processes computer-executable instructions to cause the plasma processing apparatus 1a to perform various processes to be described in the present disclosure. The controller 1b may be configured to control the respective components of the plasma processing apparatus 1a to perform the various processes to be described herein below. In an embodiment, a portion of the controller 1b or the entire controller 1b may be included in the plasma processing apparatus 1a. The controller 1b may include, for example, a computer 61. The computer 61 may include, for example, a processor (central processing unit; CPU) 611, a storage unit 612, and a communication interface 613. The processor 611 may be configured to perform various control operations based on programs stored in the storage unit 612. The storage unit 612 may include a RAM (random access memory), a ROM (read only memory), an HDD (hard disk drive), an SSD (solid state drive), or a combination thereof. The communication interface 613 may communicate with the plasma processing apparatus 1a via a communication line such as a LAN (local area network). Further, the controller 1b may be configured by a processor (e.g., a CPU) that collectively controls the plurality of processing apparatuses PM1 to PM6 provided in the transfer system 1000 illustrated in FIG. 1. Further, the controller 1b may control the entire operation of the transfer system 1000. Further, another control device may be provided as a higher-level device of the controller 1b that controls each processing apparatus PM, to collectively control the respective components. For example, the controller 1b or the higher-level device may control the transfer path and the transfer timing for transferring the substrate W and the edge ring ER (113) by the first transfer device TM1 and the second transfer device TM2.

(Example of Flow of Cleaning Process)

Figure 3:
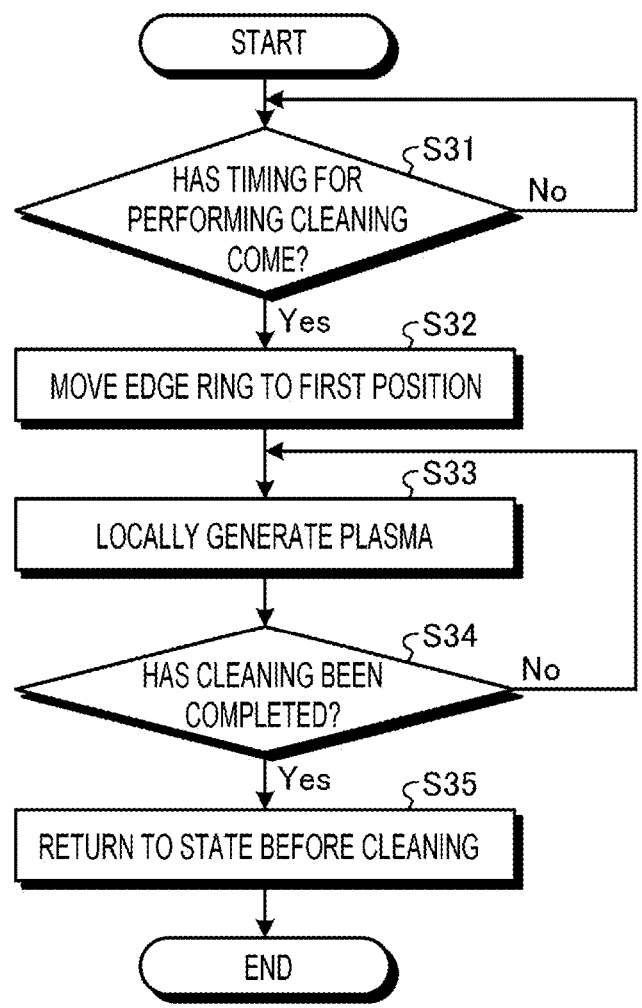
FIG. 3 is a flowchart illustrating an example of the flow of a cleaning method according to an embodiment.

FIG. 3 is a flowchart illustrating an example of the flow of a cleaning method according to an embodiment. Each process illustrated in FIG. 3 is performed under the control of the controller 1b based on, for example, a recipe stored in the storage unit 612.

First, the controller 1b determines whether a timing for performing a cleaning has come (step S31). When it is determined that the timing for performing a cleaning has not come (step S31, No), the controller 1b repeats step S31. When it is determined that the timing for performing a cleaning has come (step S31, Yes), the controller 1b controls the respective components of the plasma processing apparatus 1a and the transfer system 1000 to move the edge ring 113 disposed on the substrate support 11 to a first position spaced apart from the substrate support 11 (step S32).

The first position refers to a position where the distance between the edge ring 113 and the second placement surface 11b is several millimeters to about 20 millimeters, preferably about 2 millimeters to about 10 millimeters. In an embodiment, the distance between the edge ring 113 at the first position and the substrate support 11 falls in the range of 1 mm to 20 mm.

When the edge ring 113 is placed at the first position, then, the controller 1b generates a local plasma between the edge ring 113 and the substrate support 11 (step S33).

First, the controller 1b causes the gas supply 20 to supply a cleaning gas into the chamber 10, while maintaining the edge ring 113 at the first position. The gas to be supplied is a gas suitable for a cleaning process using a plasma processing, that is, the removal of deposits that adhere to the inside of the chamber 10. The gas to be supplied may be, for example, a gas containing any one of oxygen ($O_2$), fluorine (F), nitrogen ($N_2$), and hydrogen (H). The gas to be supplied may be, for example, $NH_3$, $NF_3$, or $CF_2$. Accordingly, the cleaning gas includes a gas selected from the group consisting of oxygen-containing gas, $NH_3$ gas, $NF_3$ gas, $CF_2$ gas, and a combination thereof.

Then, the controller 1b adjusts the pressure in the chamber 10. The pressure in the chamber 10 is adjusted to a pressure higher than that during the plasma processing (e.g., etching) of the substrate W. For example, the pressure in the chamber 10 is adjusted to about 10 mTorr or more, preferably about 10 mTorr to about 200 Torr, or more preferably about 500 mTorr to about 100 Torr.

Then, the controller 1b causes the RF power supply 30 to supply the RF power (the RF signals) to the substrate support 11. At this time, the first RF signal (i.e., a power of a relatively high frequency for generating plasma) is supplied from the RF generator 31a to the substrate support 11. Further, the second RF signal (e.g., a power of a relatively low frequency for attracting ions) may be supplied from the RF generator 31b to the substrate support 11. The plasma processing apparatus 1a may include a DC power supply configured to supply a DC pulse power (a DC pulse signal) to the substrate support 11, in addition to or instead of the RF power supply 30. Accordingly, the plasma processing apparatus 1a includes a power source configured to supply the power to the substrate support 11. The power source may be an RF power source or a DC power source. Then, the cleaning method according to the embodiment includes supplying the power to the substrate support 11 while supplying the cleaning gas into the chamber 10, so as to generate a local plasma in the gap between the edge ring 113 at the first position and the substrate support 11. As a result, the lower surface of the edge ring 113 and the second placement surface 11b of the substrate support 11 are cleaned. The power supplied is an RF power or a pulse power. The pulse power is an RF pulse power or a DC pulse power. Further, the power is supplied to at least one of the lower electrode 111, and first and second electrodes to be described later.

Next, the controller 1b determines whether the cleaning has been completed (step S34). For example, the controller 1b determines that the cleaning has been completed, when a preset time has elapsed. It may be separately determined whether the cleaning has been completed, using a sensor or the like. When it is determined that the cleaning has not been completed (step S34, No), the controller 1b returns to step S33, and continues the process. Meanwhile, when it is determined that the cleaning has been completed (step S34, Yes), the controller 1b stops the generation of plasma, and returns each component of the plasma processing apparatus 1a to the state before the cleaning is performed (step S35). Then, the cleaning process is ended.

Figure 4:
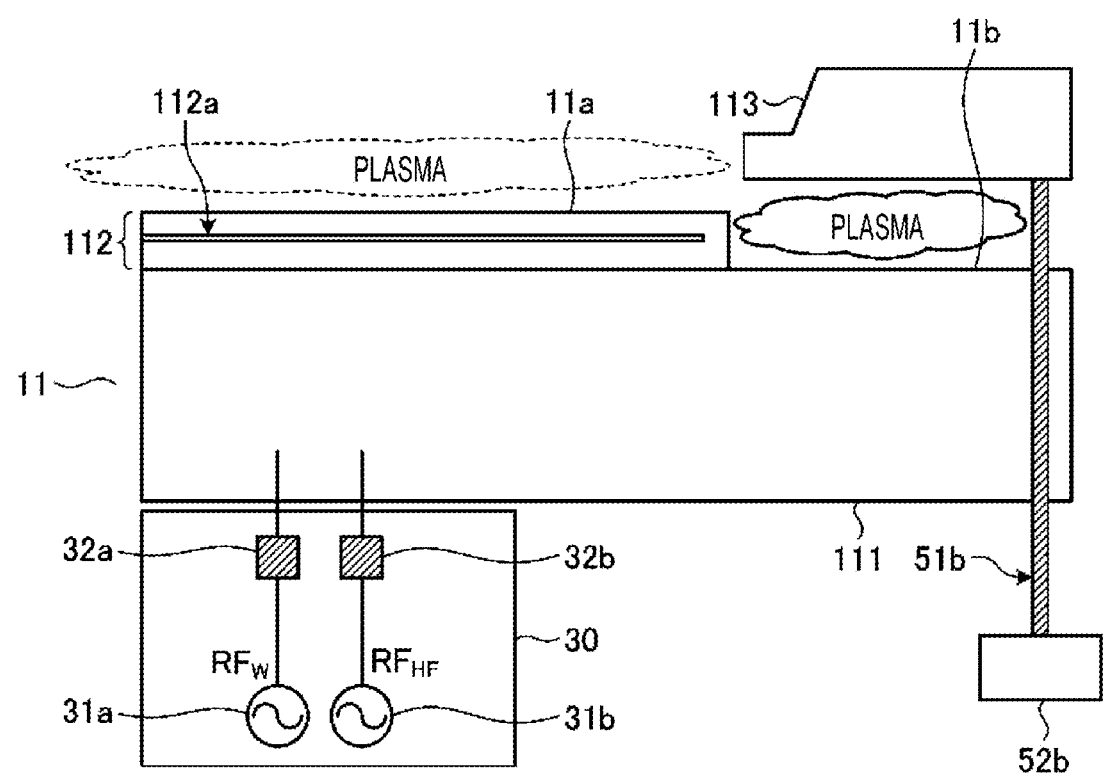
FIG. 4 is a view illustrating a positional relationship between an edge ring and a substrate support when the cleaning method according to the embodiment is performed.

FIG. 4 is a view illustrating a positional relationship between the edge ring 113 and the substrate support 11 when the cleaning method according to the embodiment is performed. In FIG. 4, the edge ring 113 is lifted from the second placement surface 11b, and held at the first position. Thus, a substantially closed space is formed between the second placement surface 11b and the edge ring 113. When the radio-frequency power is supplied to the lower electrode 111 in this state, the plasma density differs between the relatively small space above the second placement surface 11b and below the edge ring 113, and the relatively large space above the first placement surface 11a. Then, the deposits at the position where the plasma density is relatively high may be intensively removed. In the example of FIG. 4, the deposits that adhere to the lower surface of the edge ring 113, the stepped portion between the first placement surface 11a and the second placement surface 11b, and the second placement surface 11b may be intensively removed. When the pressure in the chamber 10 is set to a relatively high pressure, for example, 10 mTorr or more, the plasma is prevented from being diffused in the substantially closed space between the second placement surface 11b and the edge ring 113, so that the plasma density may be maintained in the relatively high state. Since the density of the plasma formed on the first placement surface 11a is lower than the density of the plasma formed on the second placement surface 11b, the damage to the first placement surface 11a exposed to the plasma processing space 10s may be suppressed. In the example of FIG. 4, the radio-frequency power for generating a local plasma is supplied to the lower electrode 111. A power is supplied to the electrode 112a (the first electrode) in the electrostatic chuck 112 from a power source provided separately from the RF power supply 30.

(Use of Jig Instead of Edge Ring)

In the embodiment described above, the cleaning is performed in a state where the edge ring 113 is placed at the first position. Instead of the edge ring, the cleaning may be performed in a state where a jig having the same shape as that of the edge ring 113 is placed at the first position. For example, when the edge ring 113 is replaced, the jig may be carried into the chamber 10 after the old edge ring 113 is transferred from the chamber 10 and before a new edge ring 113 is transferred into the chamber 10, and the cleaning may be intensively performed on the second placement surface 11b. In this case, the portion close to the substrate support 11 may be intensively cleaned without considering the deposits that adhere to the edge ring 113.

In order to suppress the damage to the first placement surface 11a caused from the cleaning, the cleaning may be performed after a dummy wafer is placed on the first placement surface 11a. The inner diameter of the edge ring 113 is smaller than the outer diameter of an ordinary product wafer. Thus, the edge ring 113 may not be automatically lifted by the second lifter pin 51b in a state where the product wafer is placed on the first placement surface 11a. Thus, the outer diameter of the dummy wafer for the cleaning is set to be smaller than the inner diameter of the edge ring 113. When the outer diameter of the dummy wafer is set to be smaller than that of the product wafer, the edge ring 113 may be automatically moved up and down in a state where the dummy wafer is placed on the substrate support 11.

When the dummy wafer is used for the cleaning, first, the product wafer is transferred from the chamber 10. Then, the dummy wafer is transferred into the chamber 10 along the same procedure as that when the product wafer is transferred into the chamber 10. Then, the cleaning is performed along the procedure illustrated in FIG. 3.

(Determination of Timing for Performing Cleaning)

The determination of the timing for performing the cleaning in step S31 may be performed based on, for example, any one of the following determinations.

(1) Whether the etching has been performed a predetermined number of times (2) Whether the etching has been completed on a predetermined number of substrates (3) Whether the cumulative time during which the etching has been performed reaches a predetermined time (4) Whether the amount of deposits calculated based on deposit distribution information 622 is equal to or higher than a threshold value (5) Whether the electrostatic adsorption operation of the substrate (wafer) or the edge ring is normal Further, the determination of the timing for performing the cleaning may be performed based on the following determinations, in addition to the determinations described above.

(1) Whether the etched substrate W has been transferred from the chamber 10

(2) Whether the etched substrate W has been transferred to a position that does not cause any interference when the edge ring 113 is lifted to the first position (3) Whether the placement of the dummy wafer on the substrate support 11 has been completed (4) Whether the placement of the cleaning jig on the second placement surface 11b has been completed When the determination of the timing for performing the cleaning is performed based on the determination (2) above, the cleaning may be started at a relatively earlier timing, and the processing efficiency of the cleaning may be further improved.

(Position to which Cleaning Gas is Introduced)

In the embodiment described above, the gas used for the cleaning is supplied into the chamber 10 by the gas supply 20. Instead of this configuration, for example, the cleaning gas may be supplied into the chamber 10 from the second through hole 11d formed in the second placement surface 11b. In this case, a gas supply path may be additionally formed to extend from the gas supply 20 to the substrate support 11, and communicate with the second through hole 11d. Accordingly, the cleaning gas is supplied from the second placement portion of the substrate support 11 into the gap between the edge ring 113 and the second placement portion. With this configuration, when deposits adhere to the inside of the second through hole 11d during the etching, the deposits may be efficiently removed.

(Aspect of Applying Voltage)

In the embodiment described above, the radio-frequency power is supplied to the lower electrode 111 so as to generate plasma. However, when the deposits deposited on the edge ring 113 and the second placement surface 11b are intensively removed, it is more convenient to supply the radio-frequency power to the vicinity of the second placement surface 11b, so as to generate plasma. Thus, Modifications 1 to 6 in which the aspect of applying the voltage varies will be described below.

(Modification 1)

Figure 5A:
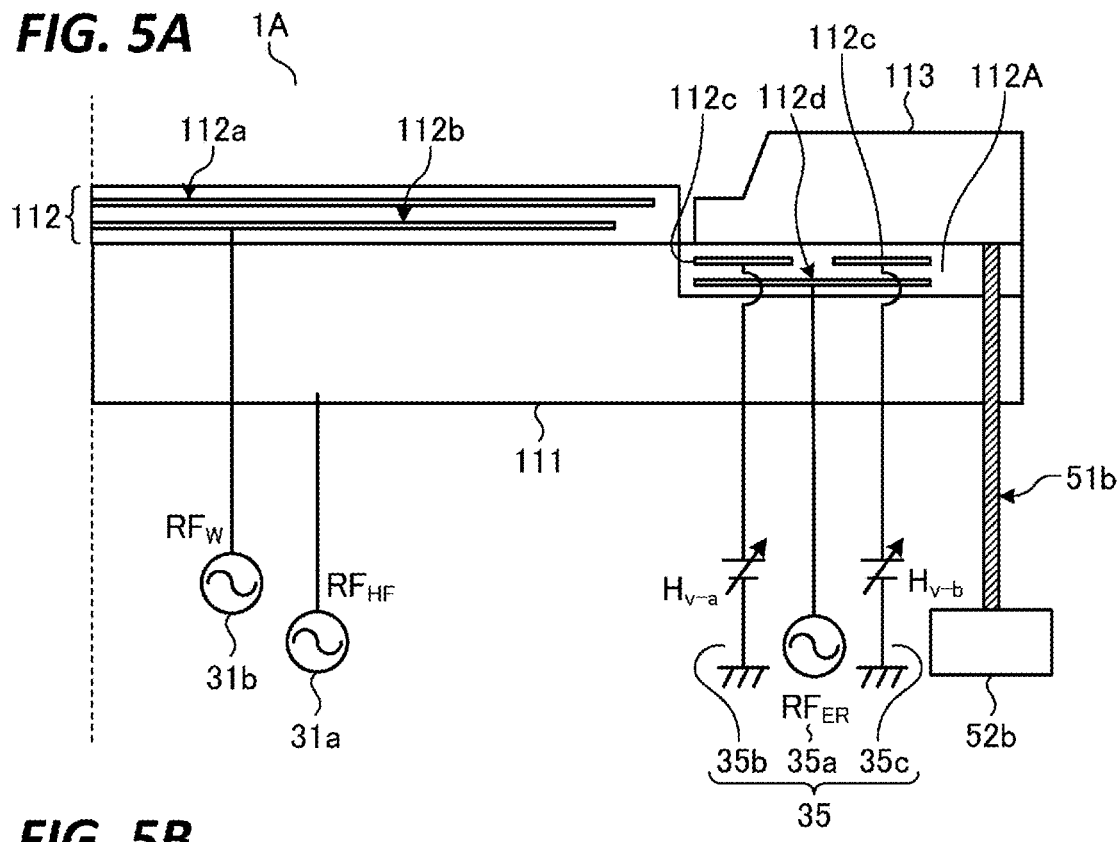
FIG. 5A is a view illustrating an example of a configuration of a plasma processing apparatus according to Modification 1.

FIG. 5A is a view illustrating an example of a configuration of a plasma processing apparatus 1A according to Modification 1. FIG. 5A is substantially the same as the plasma processing apparatus 1a illustrated in FIG. 4, and different from the plasma processing apparatus 1a of FIG. 4 in view of the destination to which the voltage from the RF power supply 30 is applied. The electrostatic chuck 112 provided in the plasma processing apparatus 1A illustrated in FIG. 5A includes the first electrode. That is, the substrate support 11 includes the first placement portion on which the substrate is to be placed, and the first placement portion includes the first electrode. The first electrode includes the electrode 112a (for adsorption) and an electrode 112b (for bias application). Then, the radio-frequency power (for bias) generated by the RF generator 31b is applied to the electrode 112b. The RF generator 31b is an example of a first power source. Further, the plasma processing apparatus 1A includes a second electrostatic chuck 112A for adsorbing the edge ring thereon. The second electrostatic chuck 112A includes a second electrode. That is, the substrate support 11 includes the second placement portion on which the edge ring 113 is disposed, and the second placement portion includes the second electrode. The second electrode includes one or more electrodes 112c (for adsorption) and an electrode 112d (for bias application). Further, the plasma processing apparatus 1A includes a second power supply 35. The second power supply 35 includes an RF generator 35a and DC power supplies 35b and 35c. The RF generator 35a is an example of a second power source. The second power supply 35 is configured to be able to supply a power to the second electrostatic chuck 112A independently from the RF power supply 30. In the example of FIG. 5A, the two electrodes 112c make up a bipolar electrode. When DC voltages $H_{v-a}$ and $H_{v-b}$ are applied to generate a potential difference between the two electrodes 112c, the edge ring 113 is adsorbed.

During the etching, an RF signal $RF_{HF}$ is supplied from the RF generator 31a to the lower electrode 111 so as to generate plasma. Further, an RF signal $RF_W$ is supplied from the RF generator 31b to the electrode 112b so as to generate a bias. Further, a DC power is supplied to the electrode 112a from a power source (not illustrated) so as to electrostatically adsorb the substrate W to the electrostatic chuck 112. During the etching, the second power supply 35 supplies the DC voltages $H_{v-a}$ and $H_{v-b}$ from the DC power supplies 35b and 35c to the electrodes 112c, so as to generate a potential difference between the two electrodes 112c and adsorb the edge ring 113 to the second placement surface 11b. Further, an RF signal $RF_{ER}$ for bias may be supplied from the RF generator 35a to the electrode 112d. During the etching, each of the substrate W to be processed and the edge ring 113 is adsorbed to the substrate support 11 by its corresponding electrostatic chuck. Further, a bias power is supplied to the vicinity of the placement surface. During the etching, the voltages applied to the two electrodes 112c may be the same. For example, both the voltages applied to the two electrodes 112c may have the same polarity (e.g., the positive polarity) as that applied when the substrate W is electrostatically adsorbed.

Figure 5B:
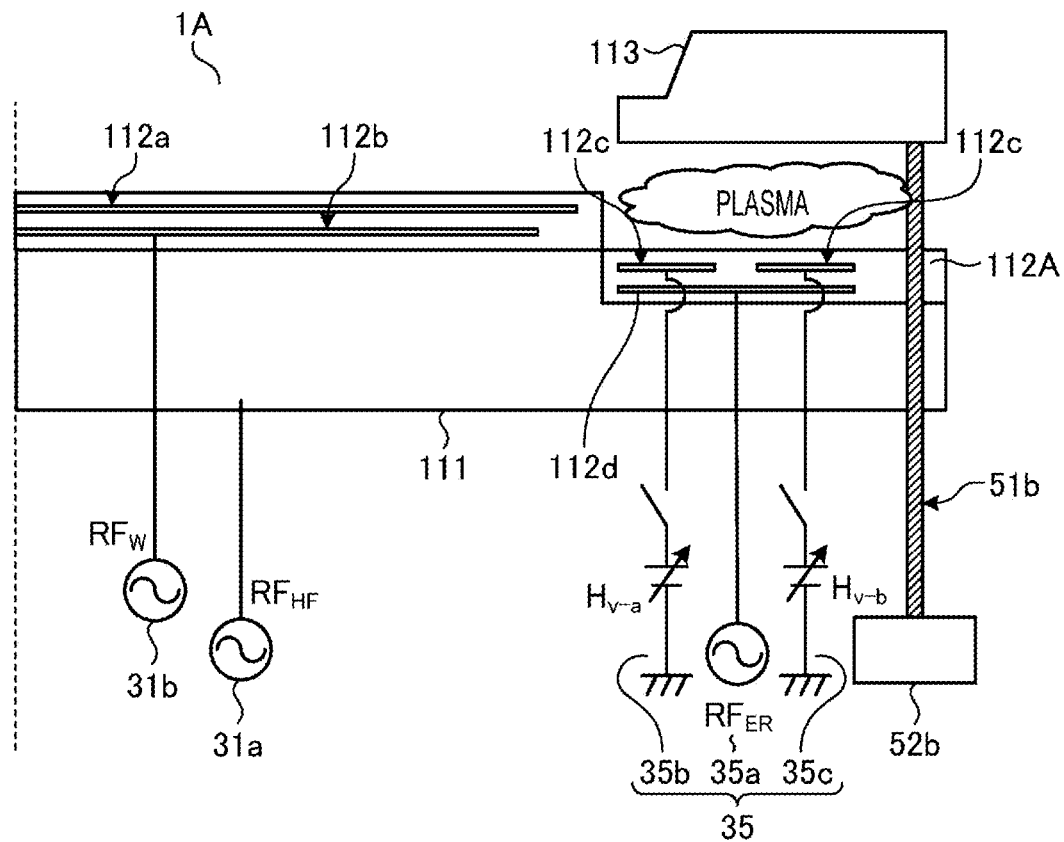
FIG. 5B is a view illustrating a positional relationship of respective components of the plasma processing apparatus according to Modification 1 when the cleaning is performed using the plasma processing apparatus.

FIG. 5B is a view illustrating a positional relationship of the respective components of the plasma processing apparatus 1A according to Modification 1 when the cleaning is performed using the plasma processing apparatus 1A.

During the cleaning, the supply of the DC powers from the DC power supplies 35b and 35c is turned OFF. The edge ring 113 is lifted from the second placement surface 11b to the first position. Then, the voltage for generating plasma is applied to the substrate support 11. In Modification 1, the RF signals are not supplied from the RF generators 31a and 31b during the cleaning. Meanwhile, the RF signal from the RF generator 35a is supplied to the electrode 112d. As a result, a local plasma is generated in the space between the edge ring 113 and the second placement surface 11b. The power from the RF generator 31a may be mainly supplied to the edge ring.

The electrodes 112c of the second electrostatic chuck 112A may be unipolar electrodes. Then, the DC voltages may be applied to the unipolar electrodes, to adsorb the edge ring 113 to the substrate support 11.

In the examples of FIGS. 5A and 5B, the electrostatic chuck for the substrate and the electrostatic chuck for the edge ring are provided separately. The present disclosure is not limited to this configuration, and the electrode for the substrate and the electrode for the edge ring may be disposed at their corresponding placement positions, respectively, in one dielectric. In the examples of FIGS. 5A and 5B, different power supplies perform the supply of power to the first placement surface 11a and the supply of power to the second placement surface 11b, respectively. Without being limited to this configuration, a common power supply may supply the power to the vicinity of the first placement surface 11a and the second placement surface 11b (see, e.g., FIGS. 9 and 10). Further, a heat transfer sheet or the like may be disposed between the edge ring 113 and the second placement surface 11b.

(Modification 2)

Figure 6A:
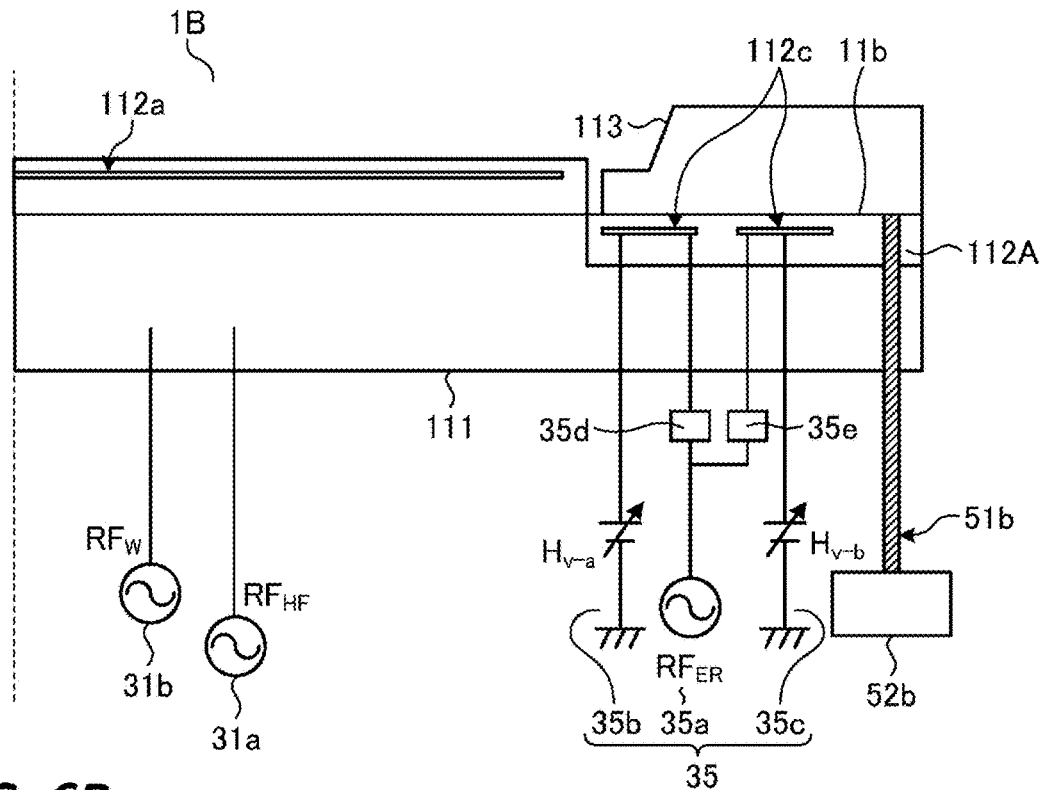
FIG. 6A is a view illustrating an example of a configuration of a plasma processing apparatus according to Modification 2.

FIG. 6A is a view illustrating an example of a configuration of a plasma processing apparatus 1B according to Modification 2. In the plasma processing apparatus 1B, the RF signals are supplied from the RF power supply 30 to the lower electrode 111, as in the plasma processing apparatus 1a illustrated in FIG. 4. The electrode 112a is disposed in the electrostatic chuck 112. Further, in the plasma processing apparatus 1B, the second electrostatic chuck 112A is disposed below the second placement surface 11b. The electrodes 112c (second electrodes) are disposed in the second electrostatic chuck 112A. The electrodes 112c are similar to those illustrated in FIG. 5A. However, unlike the plasma processing apparatus 1A of FIG. 5A, the plasma processing apparatus 1B does not include the electrode 112d. Further, blocking elements 35d and 35e are disposed between the RF generator 35a and the electrodes 112c.

In Modification 2, the RF signals are supplied from the RF generators 31a and 31b to the lower electrode 111 during the etching. Further, a DC power is from a power source (not illustrated) to the electrode 112a (the first electrode for adsorption). Further, the DC powers for adsorption are supplied from the DC power supplies 35b and 35c to the electrodes 112c of the second electrostatic chuck 112A.

Figure 6B:
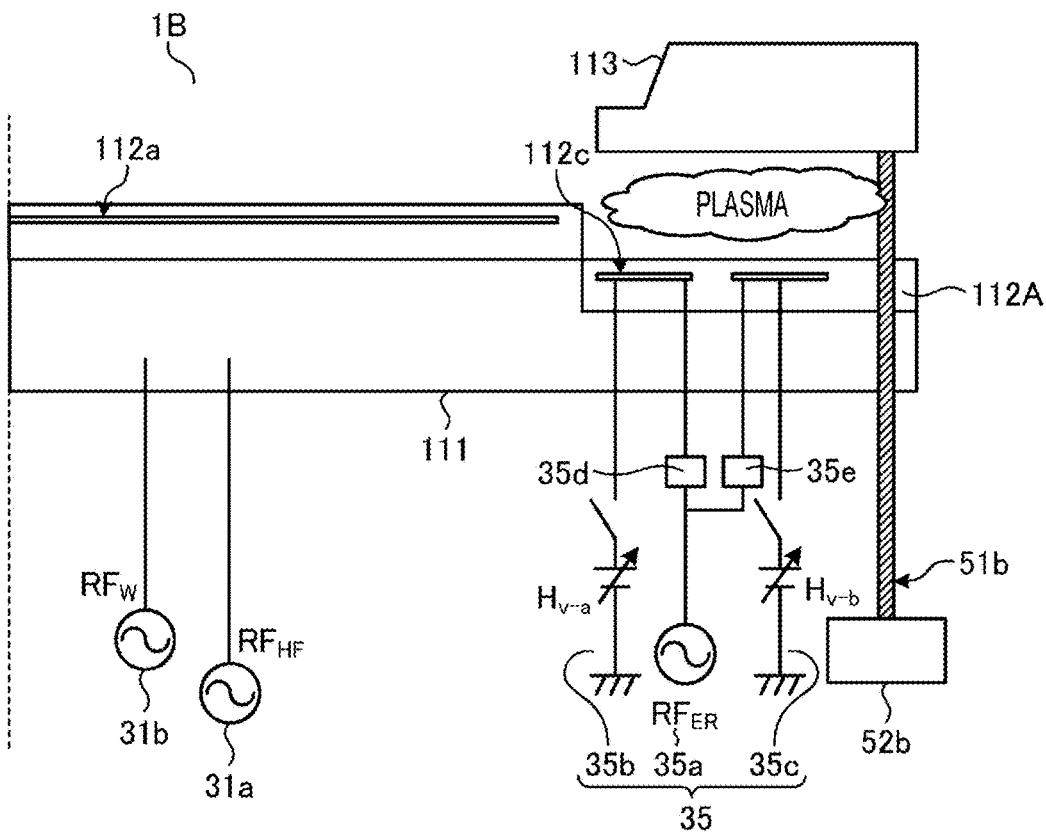
FIG. 6B is a view illustrating a positional relationship of respective components of the plasma processing apparatus according to Modification 2 when the cleaning is performed using the plasma processing apparatus.

FIG. 6B is a view illustrating a positional relationship of the respective components of the plasma processing apparatus 1B according to Modification 2 when the cleaning is performed using the plasma processing apparatus 1B. During the cleaning, the supply of the powers from the DC power supplies 35b and 35c is turned OFF. Then, the edge ring 113 is lifted to the first position. Then, the RF signal is supplied from the RF generator 35a to the electrodes 112c, so as to generate a local plasma between the edge ring 113 and the second placement surface 11b. The blocking elements (filters) 35d and 35e are, for example, blocking capacitors, and prevent the current supplied from the DC power supplies 35b and 35c to the electrodes 112c from flowing to the RF generator 35a.

(Modification 3)

Figure 7A:
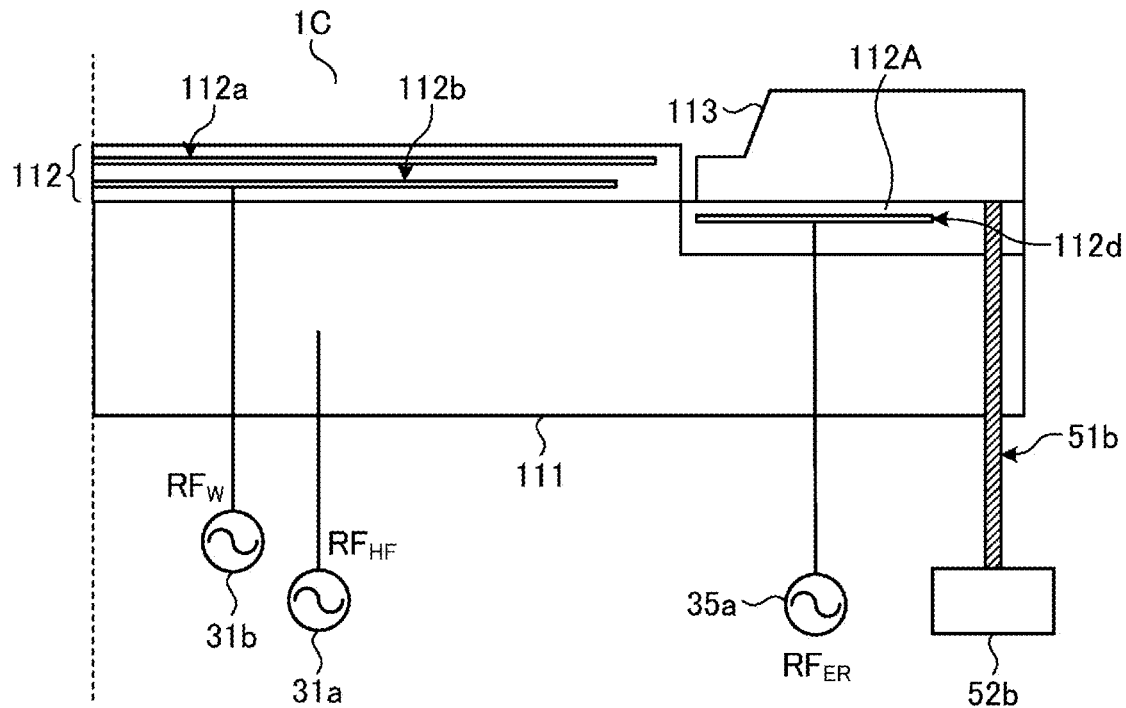
FIG. 7A is a view illustrating an example of a configuration of a plasma processing apparatus according to Modification 3.

FIG. 7A is a view illustrating an example of a configuration of a plasma processing apparatus 1C according to Modification 3. Unlike the plasma processing apparatuses 1A and 1B, the plasma processing apparatus 1C does not include the electrodes 112c (for adsorption) below the second placement surface 11b, and includes only the electrode 112d (for bias application). The configuration of the substrate W is the same as that in Modification 1.

Figure 7B:
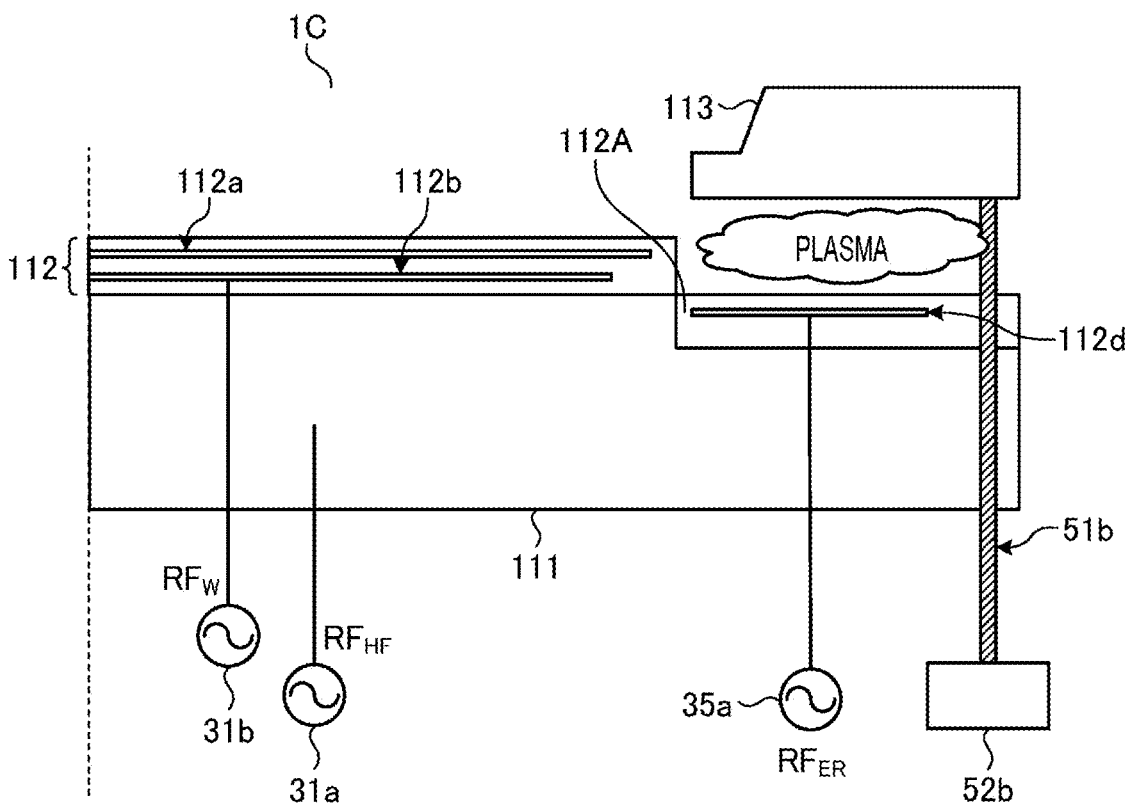
FIG. 7B is a view illustrating a positional relationship of respective components of the plasma processing apparatus according to Modification 3 when the cleaning is performed using the plasma processing apparatus.

FIG. 7B is a view illustrating a positional relationship of the respective components of the plasma processing apparatus 1C according to Modification 3 when the cleaning is performed using the plasma processing apparatus 1C. When the cleaning is performed, first, the edge ring 113 is lifted to the first position by the second lifter pin 51b. Then, the RF signal is supplied from the RF generator 35a to the electrode 112d. As a result, a local plasma is generated between the edge ring 113 and the second placement surface 11b. The cleaning is performed by the generated plasma. When the RF signal is supplied to the lower electrode 111, a plasma is easily generated on the substrate W as well. Thus, by selecting the height of the edge ring 113 and the pressure in the chamber 10, it is possible to intensively generate a plasma in the gap between the edge ring 113 and the substrate support 11.

(Modification 4)

Figure 8:
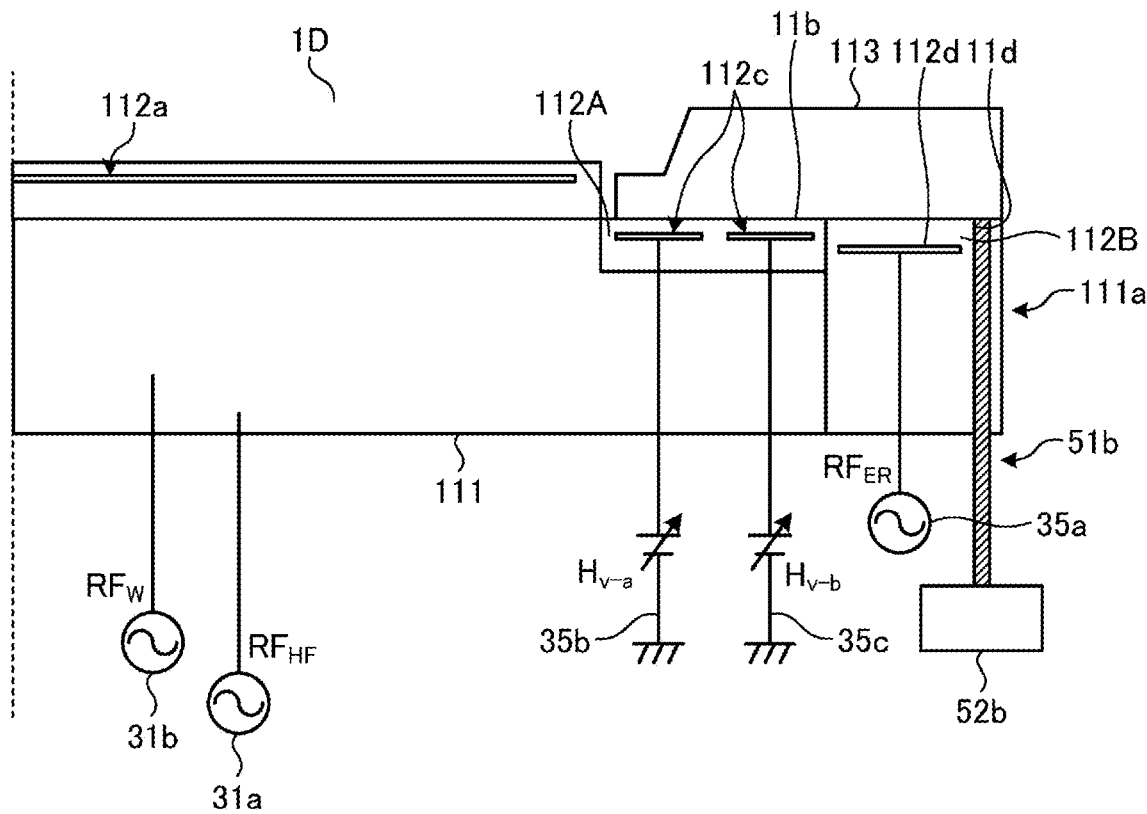
FIG. 8 is a view illustrating an example of a configuration of a plasma processing apparatus according to Modification 4.

FIG. 8 is a view illustrating an example of a configuration of a plasma processing apparatus 1D according to Modification 4. The plasma processing apparatus 1D includes the second electrostatic chuck 112A below the second placement surface 11b. The electrodes 112c (second electrodes for adsorption) are disposed in the second electrostatic chuck 112A. Further, the plasma processing apparatus 1D includes a dielectric ring 112B on the outer periphery of the second electrostatic chuck 112A. The dielectric ring 112B is made of, for example, quartz, and has a ring shape that surrounds the lower electrode 111. The electrode 112d (a second electrode for applying a bias) is disposed in the dielectric ring 112B. The DC powers are supplied from the DC power supplies 35b and 35c to the electrodes 112c. The RF signal is supplied from the RF generator 35a to the electrode 112d. The second through hole 11d penetrates the dielectric ring 112B, and the second lifter pin 51b may move the edge ring 113 up and down through the second through hole 11d. The configuration of the substrate W is the same as that of the plasma processing apparatus 1a of FIG. 4.

During the etching, the RF signals are supplied from the RF generators 31a and 31b to the lower electrode 111, and the RF signal is supplied from the RF generator 35a to the electrode 112d. Further, a DC power is supplied to the electrode 112a from a power source (not illustrated), and the edge ring 113 is adsorbed to the second placement surface 11b by the DC powers supplied from the DC power supplies 35b and 35c to the electrodes 112c. During the cleaning, the supply of the powers to the electrodes 112c is turned OFF, and the edge ring 113 is lifted to the first position by the second lifter pin 51b. Then, the RF signal is applied to the electrode 112d so as to generate a local plasma. As a result, a local plasma is generated between the lower surface of the edge ring 113 and the second placement surface 11b as in the other modifications. The cleaning is performed by the generated plasma.

(Modification 5)

Figure 9:
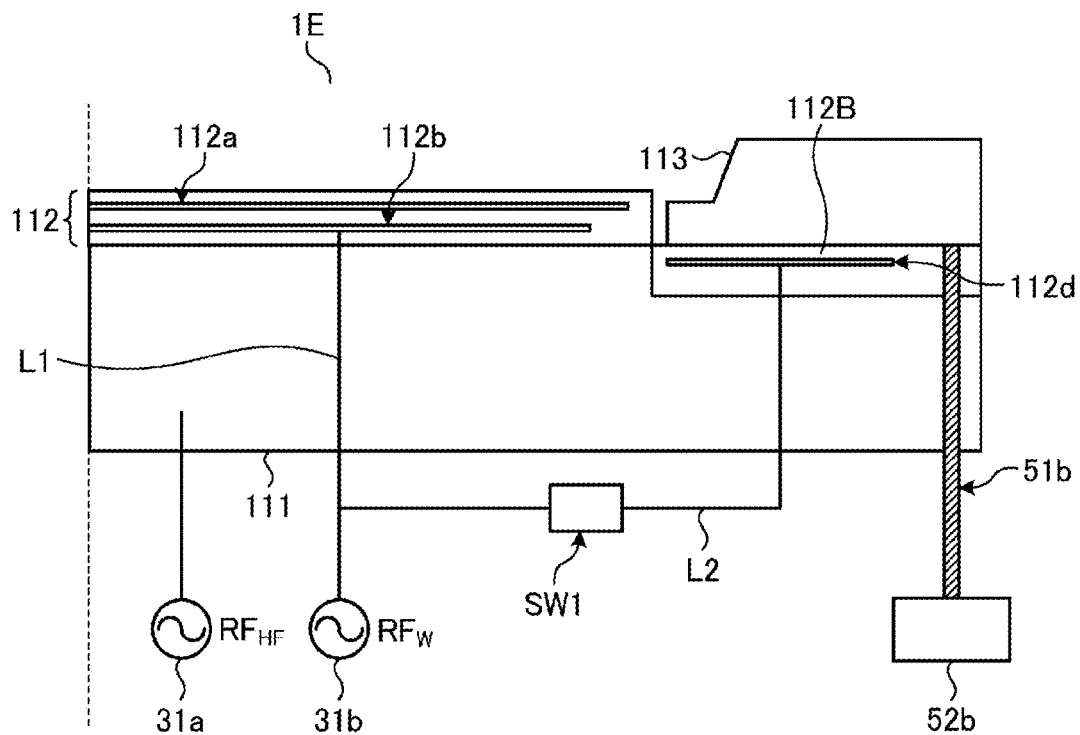
FIG. 9 is a view illustrating an example of a configuration of a plasma processing apparatus according to Modification 5.

FIG. 9 is a view illustrating an example of a configuration of a plasma processing apparatus 1E according to Modification 5. While the configuration of the plasma processing apparatus 1E is the same as that of the plasma processing apparatus 1C (see, e.g., FIG. 7A) according to Modification 3, the plasma processing apparatus 1E is able to supply the RF signal from the RF generator 31b to the electrode 112d close to the edge ring 113 as well. In the example of FIG. 9, a first line L1 for supplying the RF signal extends from the RF generator 31b, and branches to a second line L2 in the middle thereof. The second line L2 connects the RF generator 31b and the electrode 112d to each other. A switching element SW1 is disposed on the second line L2. The switching element SW1 is, for example, a variable impedance element. Instead of the switching element SW1, a power distribution circuit may be disposed. The switching element SW1 is an example of a first switching element.

In the plasma processing apparatus 1E, in an example, the switching element SW1 adjusts the balance between the RF signal supplied to the electrode 112b and the RF signal supplied to the electrode 112d, during the etching. For example, the switching element SW1 adjusts the impedance in order to make the plasma distribution uniform during the etching. In another example, the ratio of the RF signals supplied to the electrodes 112b and 112d during the etching may be adjusted so as to supply the radio-frequency power to the edge ring 113 as well. With this configuration, the in-plane density of plasma or the etching rate may be adjusted. Accordingly, the plasma processing is performed on the substrate W before the cleaning to be described later is performed. In the plasma processing, a first power is supplied from the RF generator 31b to the electrode 112b or the lower electrode 111. In the plasma processing, the first power may be supplied to the electrode 112d as well.

During the cleaning, the supply of the power to the electrode 112d is turned OFF, and the edge ring 113 is lifted to the first position by the second lifter pin 51b. Then, the RF signal is applied to the electrode 112d so as to generate a local plasma. At this time, the switching element SW1 is set such that the power supplied to the electrode 112d is larger than the power supplied to the electrode 112b, contrary to those during the etching. Further, during the cleaning, a more power is supplied than that during the etching. As a result, a local plasma is generated between the lower surface of the edge ring 113 and the second placement surface 11b. The cleaning is performed by the generated plasma. Accordingly, in the cleaning process, the second power larger than the first power is supplied from the RF generator 31b to the electrode 112d via the switching element SW1.

With this configuration, the substrate W and the edge ring 113 may share the power generator without increasing the number of power generators, and the space below the placement surface may be effectively used so that the increase in footprint of the apparatus may be suppressed.

(Modification 6)

Figure 10:
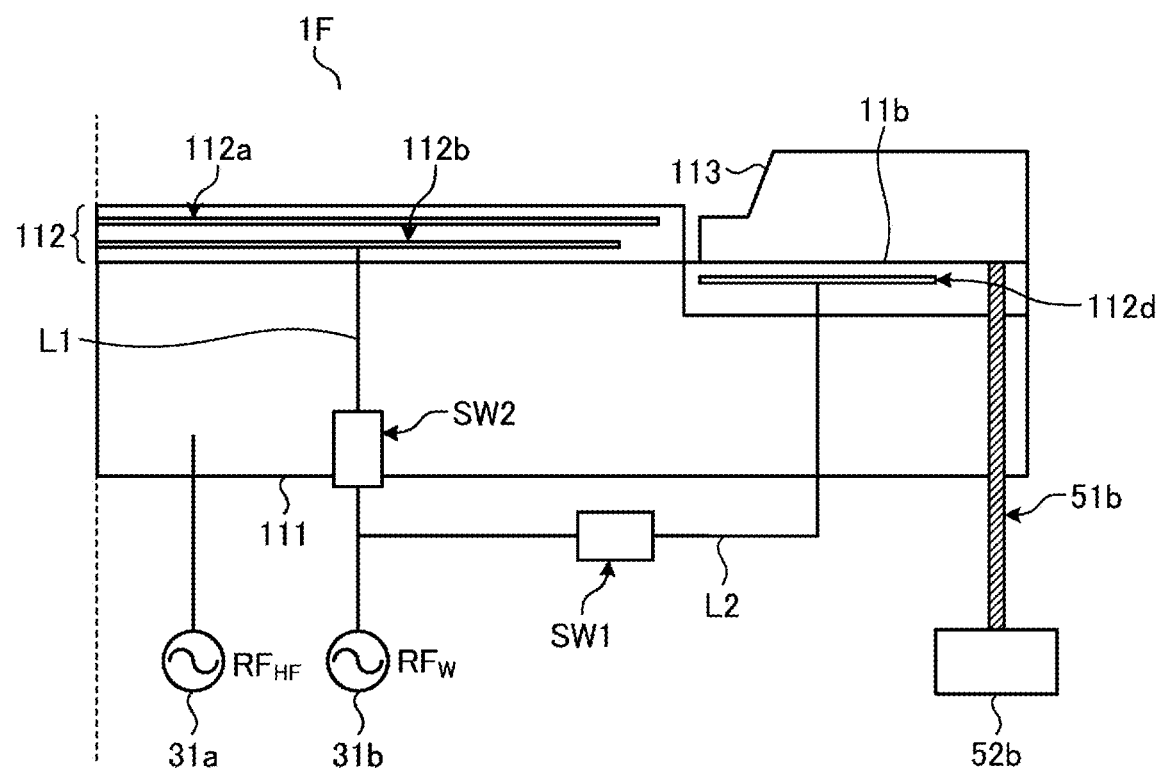
FIG. 10 is a view illustrating an example of a configuration of a plasma processing apparatus according to Modification 6.

FIG. 10 is a view illustrating an example of a configuration of a plasma processing apparatus 1F according to Modification 6. The configuration of the plasma processing apparatus 1F is substantially the same as that of the plasma processing apparatus 1E of Modification 5. However, the plasma processing apparatus 1F includes a switching element SW2 disposed on the first line L1, in addition to the switching element SW1. Similar to the switching element SW1, the switching element SW2 is, for example, a variable impedance element. The switching element SW2 is an example of a second switching element. Instead of each of the switching elements SW1 and SW2, a power distribution circuit may be disposed. When the switching elements are provided on both the first line L1 and the second line L2 in this way, the amount of power applied to each of the electrodes 112b and 112d may be further finely adjusted.

During the etching, the RF signal is supplied from the RF generator 31a to the lower electrode 111. Further, the RF signal is supplied from the RF generator 31b to the electrode 112*b* so as to generate a bias. Further, the RF signal is supplied from the RF generator 31*b* to the electrode 112*d*, so as to electrostatically adsorb the edge ring 113 to the second placement surface 11*b*. Further, a DC power is supplied from a power source (not illustrated) to the electrode 112*a* so as to electrostatically adsorb the substrate W to the electrostatic chuck 112. During the etching, the switching elements SW1 and SW2 adjust the balance between the RF signal supplied to the electrode 112*b* and the RF signal supplied to the electrode 112*d*. The aspect of adjusting the balance is the same as that in Modification 5.

During the cleaning, the supply of the power to the electrode 112*d* is turned OFF, and the edge ring 113 is lifted to the first position by the second lifter pin 51*b*. Then, the RF signal is applied to the electrode 112*d* so as to generate a local plasma. At this time, the switching elements SW1 and SW2 are set such that the power supplied to the electrode 112*d* is larger than the power supplied to the electrode 112*b*, contrary to those during the etching. Further, during the cleaning, a more power is supplied than that during the etching. As a result, a local plasma is generated between the lower surface of the edge ring 113 and the second placement surface 11*b*. The cleaning is performed by the generated plasma.

Modifications 1 to 6 have been described. In each modification, the power applied to the first electrodes 112*a* and 112*b*, the second electrodes 112*c* and 112*d*, and the lower electrode 111 may be a radio-frequency power set in advance for generating plasma during the etching. Further, a radio-frequency power for generating a bias may be additionally applied. Further, a voltage may be applied from a separately installed DC power source.

In the embodiments described above, the plasma generation source is not particularly limited, and a remote radical source may be used. Further, a plasma may be generated close to the upper electrode, and the cleaning may be performed by using a physical impact.

Effects of Embodiments

As described above, in the cleaning method according to the embodiment, the edge ring disposed on the stage inside the chamber that defines the plasma processing space is placed at the first position spaced apart from the stage. Further, in the cleaning method, a voltage is applied to the stage while supplying a gas into the chamber in a state where the edge ring is held at the first position, so as to generate a local plasma between the edge ring and the stage. The cleaning method removes deposits that adhere to at least one of the edge ring and the stage, using the generated plasma. As described above, in the cleaning method according to the embodiment, the edge ring is placed at the first position to form a substantially closed space between the stage and the edge ring, and then, a plasma is generated. Thus, according to the cleaning method, a local plasma is generated, and at least one of the edge ring and the stage may be efficiently cleaned.

In the cleaning method according to the embodiment, the first position refers to a position where the distance between the lower surface of the edge ring and the upper surface of the stage falls within the range of 2 mm to 20 mm. According to the cleaning method, by disposing the edge ring at the position, it is possible to form the substantially closed space where a plasma may be efficiently and locally generated.

In the cleaning method according to the embodiment, in the removing process, the pressure in the chamber is set to be higher than the pressure during the processing of the substrate. For example, according to the cleaning method, in the removing process, the pressure in the chamber is set to fall in the range of 100 Torr to 10 Torr. Thus, according to the cleaning method, the diffusion of the generated plasma is suppressed so that a plasma may be efficiently and locally generated.

In the cleaning method according to the embodiment, in the removing process, oxygen-containing gas is supplied into the chamber.

In the cleaning method according to the embodiment, in the removing process, a voltage is supplied to at least one of the lower electrode, the first electrode, and the second electrode so as to generate a plasma. The lower electrode is provided in the stage, the first electrode is disposed in the first placement surface on which the substrate is to be placed, and the second electrode is disposed in the second placement surface on which the edge ring is disposed.

In the cleaning method according to the embodiment, in the removing process, the supply path of the voltage applied to either the lower electrode or the first electrode is switched to supply the voltage to the second electrode. The cleaning method according to the embodiment further includes placing a protective substrate (a wafer with a relatively small diameter) on the first placement surface, and in the removing process, the cleaning is performed on the edge ring and the substrate support in a state where the protective substrate is placed on the first placement surface.

The plasma processing apparatus according to the embodiment includes the chamber, the stage, the lifting device, the gas supply, the power supply, and the controller. The chamber defines the processing space where the plasma processing is performed. The stage is disposed in the chamber, and the substrate and the edge ring are placed on the stage. The lifting device moves the edge ring up and down. The gas supply supplies a gas into the processing space. The power supply supplies a voltage to the stage. The controller causes the respective components of the apparatus to perform the step of disposing the edge ring at the first position where the upper surface of the second placement surface and the lower surface of the edge ring are spaced apart from each other. Further, the controller applies a voltage to the stage while supplying the gas into the chamber in a state where the edge ring is held at the first position, so as to generate a local plasma between the edge ring and the stage. Then, the controller causes the respective components of the apparatus to perform the step of removing deposits that adhere to at least one of the edge ring and the stage by the generated plasma.

The plasma processing apparatus according to the embodiment further includes the carry-in/out device that transfers the edge ring into the chamber and transfers the edge ring from the chamber. The placing step is performed by at least one of the lifting device and the carry in/out device.

In the plasma processing apparatus according to the embodiment, the stage includes the lower electrode disposed in the first placement surface on which the substrate is to be placed. During the removing process, the power supply supplies a voltage to the lower electrode so as to generate a plasma.

In the plasma processing apparatus according to the embodiment, the stage includes the first placement surface on which the substrate is to be placed, the first electrode disposed in the first placement surface, and the lower electrode disposed below the first electrode. During the removing process, the power supply supplies a power to either the first electrode or the lower electrode so as to generate a plasma.

In the plasma processing apparatus according to the embodiment, the stage includes the first electrode disposed in the first placement surface on which the substrate is to be placed, the second electrode disposed in the second placement surface on which the edge ring is disposed, and the lower electrode disposed below the first electrode and the second electrode. Then, during the removing process, the power supply supplies a power to any one of the first electrode, the second electrode, and the lower electrode so as to generate a plasma.

In the plasma processing apparatus according to the embodiment, the power supply includes the first line that connects the first electrode and the power source to each other. Further, the power supply includes the second line that branches from the first line and connects the second electrode and the power source to each other. Further, the power supply includes the first switching element disposed on the second line and configured to switch the destination to which the radio-frequency voltage supplied from the power source is supplied, between the first electrode and the second electrode.

In the plasma processing apparatus according to the embodiment, the power supply further includes the second switching element disposed on the first line and configured to switch the destination of the radio-frequency voltage supplied from the power source, between the first electrode and the second electrode.

In the plasma processing apparatus according to the embodiment, the power supply includes the first power supply that supplies a power to the first electrode, and the second power supply that supplies a power to the second electrode separately from the first power supply. During the removing process, the controller controls the power supply to turn the first power supply OFF and turn the second power supply ON. The plasma processing apparatus according to the embodiment further includes an EPD device configured to detect a time for stopping the cleaning during the removing process. The plasma processing apparatus according to the embodiment further includes a detection device that detects the light emission intensity and/or current of plasma during the removing process. The controller is configured to control the lifting device to change the height of the edge ring based on the detection result of the detection device.

According to the present disclosure, the cleaning efficiency of the plasma processing apparatus may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a plasma processing chamber;
   a substrate support disposed in the plasma processing chamber, the substrate support including:
      a lower electrode;
      a first electrostatic chuck;
      and a second electrostatic chuck;
   an edge ring disposed that surrounds a substrate on the substrate support;
   an actuator configured to vertically move the edge ring between an upper position and a lower position, wherein in the upper position, a gap is formed between the edge ring and the second electrostatic chuck;
   a gas supply configured to supply a cleaning gas into the plasma processing chamber during a cleaning operation;
   the second electrostatic chuck having at least one ring electrode and the second electrostatic chuck being disposed below the edge ring in the substrate support, wherein the second electrostatic chuck is disposed between the edge ring and the lower electrode, such that the edge ring overlaps the second electrostatic chuck and the lower electrode in a vertical direction;
   a first RF generator configured to supply a first RF signal to the at least one ring electrode of the second electrostatic chuck; and
   a controller configured to control the gas supply to supply the cleaning gas into the plasma processing chamber and control the first RF generator to supply the first RF signal to the at least one ring electrode of the second electrostatic chuck to generate a plasma from the cleaning gas in the gap while the edge ring is maintained at the upper position to cause the edge ring and the second electrostatic chuck to be cleaned by the plasma, wherein during the cleaning operation, RF signals are not supplied to the lower electrode or the first electrostatic chuck.

2. The plasma processing apparatus according to claim 1, wherein the second electrostatic chuck further includes:
   at least one adsorption electrode disposed below the edge ring in the substrate support; and
   at least one DC power supply connected to the at least one adsorption electrode.

3. The plasma processing apparatus according to claim 2, wherein
   the at least one adsorption electrode of the second electrostatic chuck includes first and second adsorption electrodes, and
   the at least one DC power supply of the second electrostatic chuck includes a first DC power supply connected to the first adsorption electrode and a second DC power supply connected to the second adsorption electrode.

4. The plasma processing apparatus according to claim 3, wherein the first and second adsorption electrodes are disposed above the at least one ring electrode.

5. The plasma processing apparatus according to claim 1, wherein the at least one ring electrode includes first and second ring electrodes.

6. The plasma processing apparatus according to claim 5, further comprising:
   a first DC power supply connected to the first ring electrode;
   a second DC power supply connected to the second ring electrode;
   a first blocking element connected between the first ring electrode and the first RF generator; and
   a second blocking element connected between the second ring electrode and the first RF generator.

7. The plasma processing apparatus according to claim 1, wherein
   the first electrostatic chuck is disposed on the lower electrode and has a substrate placing surface; and
   the substrate support includes a substrate electrode disposed below the substrate placing surface in the first electrostatic chuck.

8. The plasma processing apparatus according to claim 7, wherein the second electrostatic chuck is disposed on the lower electrode and surrounds the first electrostatic chuck.

9. The plasma processing apparatus according to claim 7, further comprising a second RF generator connected to the substrate electrode.

10. The plasma processing apparatus according to claim 9, further comprising a third RF generator connected to the lower electrode.

11. The plasma processing apparatus according to claim 7, wherein the first RF generator is connected to the at least one ring electrode and the substrate electrode.

12. The plasma processing apparatus according to claim 11, further comprising a first switch connected between the first RF generator and the at least one ring electrode.

13. The plasma processing apparatus according to claim 12, further comprising a second switch connected between the first RF generator and the substrate electrode.

14. The plasma processing apparatus according to claim 1, wherein
the first electrostatic chuck is disposed on the lower electrode and has a substrate placing surface.

15. The plasma processing apparatus according to claim 14, wherein the second electrostatic chuck is disposed on the lower electrode and surrounds the first electrostatic chuck, and the at least one ring electrode is disposed in the second electrostatic chuck.

16. The plasma processing apparatus according to claim 14, further comprising a second RF generator connected to the lower electrode.

17. The plasma processing apparatus according to claim 16, further comprising a third RF generator connected to the lower electrode.

18. A plasma processing apparatus comprising:
a plasma processing chamber;
a substrate support disposed in the plasma processing chamber, the substrate support including:
  a lower electrode;
  a first electrostatic chuck; and
  a second electrostatic chuck;
an edge ring disposed that surrounds a substrate on the substrate support;
an actuator configured to vertically move the edge ring between an upper position and a lower position,
wherein in the upper position, a gap is formed between the edge ring and the second electrostatic chuck;
a gas supply configured to supply a cleaning gas into the plasma processing chamber during a cleaning operation;
the second electrostatic chuck having at least one ring electrode and the second electrostatic chuck being disposed below the edge ring in the substrate support, wherein the second electrostatic chuck is disposed between the edge ring and the lower electrode, such that the edge ring overlaps the second electrostatic chuck and the lower electrode in a vertical direction;
a first RF generator configured to supply a first RF signal to the at least one ring electrode of the second electrostatic chuck; and
a controller configured to control the gas supply to supply the cleaning gas into the plasma processing chamber and control the first RF generator to supply the first RF signal to the at least one ring electrode of the second electrostatic chuck to generate a plasma from the cleaning gas in the gap while the edge ring is maintained at the upper position to cause the edge ring and the second electrostatic chuck to be cleaned by the plasma, wherein during the cleaning operation, an RF signal is supplied to the lower electrode, but not to the first electrostatic chuck.

* * * * *